United States Patent [19]

Komatsu et al.

[11] Patent Number: 5,767,028
[45] Date of Patent: Jun. 16, 1998

[54] ALUMINUM NITRIDE SINTERED BODY AND METHOD FOR MANUFACTURING THE SAME

[75] Inventors: Michiyasu Komatsu; Takao Shirai, both of Yokohama, Japan

[73] Assignee: Kabushiki Kaisha Toshiba, Kawasaki, Japan

[21] Appl. No.: 687,445

[22] PCT Filed: Jun. 28, 1996

[86] PCT No.: PCT/JP96/01808

§ 371 Date: Sep. 18, 1996

§ 102(e) Date: Sep. 18, 1996

[87] PCT Pub. No.: WO97/03031

PCT Pub. Date: Jan. 30, 1997

[30] Foreign Application Priority Data

Jul. 11, 1995 [JP] Japan ................ 7-175029

[51] Int. Cl.$^6$ ............... C04B 35/581; F27B 9/04; F27D 7/00
[52] U.S. Cl. .................. 501/98.5; 501/98.3; 264/65
[58] Field of Search ............... 501/96, 89, 99, 501/100, 87, 98.1, 98.2, 98.3, 98.4, 98.5, 98.6; 264/63, 65

[56] References Cited

U.S. PATENT DOCUMENTS

| | | | |
|---|---|---|---|
| 4,435,513 | 3/1984 | Komeya et al. | 501/96 |
| 4,711,861 | 12/1987 | Sawamura et al. | 501/98 |
| 5,036,026 | 7/1991 | Yamakawa et al. | 501/96 |
| 5,219,803 | 6/1993 | Yamakawa et al. | 501/96 |
| 5,258,337 | 11/1993 | Cameron et al. | 501/87 |
| 5,264,388 | 11/1993 | Yamakawa et al. | 501/96 |
| 5,312,786 | 5/1994 | Yamakawa et al. | 501/98.5 |
| 5,314,850 | 5/1994 | Miyahara | 501/96 |
| 5,424,261 | 6/1995 | Harris et al. | 501/98.5 |
| 5,508,240 | 4/1996 | Komatsu et al. | 501/96 |
| 5,516,734 | 5/1996 | Kuszyk et al. | 501/98.6 |
| 5,541,145 | 7/1996 | Harris et al. | 501/98.5 |

FOREIGN PATENT DOCUMENTS

| | | |
|---|---|---|
| 61-286267 | 12/1986 | Japan . |
| 62-123072 | 6/1987 | Japan . |
| 1-242468 | 9/1989 | Japan . |

*Primary Examiner*—Mark L. Bell
*Assistant Examiner*—Louis M. Troilo
*Attorney, Agent, or Firm*—Oblon, Spivak, McClelland, Maier & Neustadt, P.C.

[57] ABSTRACT

The aluminum nitride sintered body according to the present invention comprises 1–10 % by weight of at least one element selected from a group consisting of a group IIIa element listed in periodic table, Ca, Sr and Ba in terms of the amount of an oxide thereof, 0.2–2.0 % by weight of boron carbide, at most 0.2 % by weight of at least one silicon compound selected from a group consisting of $SiO_2$, $Si_3N_4$, SiC, $Si_2N_2O$, β-Sialon, α-Sialon and poly-type aluminum nitride (Al—Si—O—N) in terms of the amount of Si component, and the balance of aluminum nitride. According to the foregoing structure, there is available an AlN sintered body in which grain growth of the AlN sintered body is inhibited; the sintered body structure is fined; coupling of grain boundaries and crystal grains is intensified, thereby improving both strength and fracture toughness of the sintered body and increasing mechanical strength and fracture toughness without impairing heat radiation characteristics intrinsic to aluminum nitride.

20 Claims, No Drawings

ALUMINUM NITRIDE SINTERED BODY AND METHOD FOR MANUFACTURING THE SAME

TECHNICAL FIELD

The present invention relates to an aluminum nitride sintered body for use as a semiconductor board (substrate) or the like and a method of manufacturing the same, and more particularly to an aluminum nitride sintered body and a method of manufacturing the same capable of significantly improving strength and fracture toughness and exhibiting excellent radiation characteristics while maintaining thermal conductivity peculiar to aluminum nitride.

BACKGROUND ART

A ceramic sintered body having a variety of excellent characteristics, such as strength, heat resistance, corrosion resistance, wear resistance and light weight and the like, as compared with the conventional metal materials has been widely used in a mechanical part, functional part, structural material and decorative material for forming a semiconductor board, electronic equipment material, engine part, material for a high-speed cutting tool, nozzle, bearing or the like that is used in severe temperature, stress and wear conditions under which conventional metal materials cannot be used satisfactorily.

Since an aluminum nitride (AlN) sintered body is an insulating body having excellent thermal conductivity and a thermal expansion coefficient near that of silicon (Si), it has been further widely used as a heat radiation plate or a substrate of a highly-integrated semiconductor apparatus.

The aluminum nitride sintered body has been usually mass-produced by the following manufacturing method. That is, a sintering agent, an organic binder and, if necessary, any of various additives, a solvent and a dispersant are added to a raw material powder of aluminum nitride. The obtained raw material powder mixture is, by a doctor blade method or a slip casting method, molded into a thin-plate shape or sheet-shape molded body or is press-molded into a thick-plate or a large-size molded body. Then, the thus obtained molded body is, in the air or nitrogen atmosphere, heated and dewaxed so that carbon hydride component and the like used as the organic binder is removed from the molded body and is dewaxed. The dewaxed molded body is, in nitrogen atmosphere or the like, heated to high temperature so as to be densified and sintered so that an aluminum nitride sintered body is formed.

In a case where very fine raw material powder having an average grain size of about 0.5 μm or less is used as the raw material AlN powder in the foregoing manufacturing method, a considerably fine sintered body can be obtained even if the AlN powder is used solely. However, a large quantity of impurities, such as oxygen is, in the sintering period, solid-dissolved in AlN crystal lattices or a composite oxide, such as Al—O—N, which hinders the propagation of the oscillations of the lattices, is generated, thus causing the AlN sintered body using no sintering agent to have a relatively low thermal conductivity.

In the case where AlN powder having an average grain size of 1 μm or larger is used as the raw material powder, sole use of the raw material powder cannot realize satisfactory sintering characteristics. Therefore, it is difficult to obtain a sintered body having high density if no sintering agent is added, except the hot pressing method. In this case, a problem arises in that the mass-productivity is unsatisfactory. Accordingly, a sintered body has been usually and efficiently manufactured by a normal-pressure sintering method in such a way that the sintered body is densified and solid dissolving of impure oxygen in the raw material AlN powder into AlN crystal grains is prevented by adding a rare-earth oxide, such as a yttrium oxide ($Y_2O_3$) or an alkali-earth metal oxide, such as a potassium oxide, as a sintering agent.

It is considered that each of the foregoing sintering agents reacts with impure oxygen and $Al_2O_3$ and thus forms a liquid phase so that the sintered body is densified or fined. Moreover, the sintering agent fixes impure oxygen as a boundary grain phase and also realizes high thermal conductivity.

However, the conventional manufacturing method suffers from unsatisfactory wettability between AlN and a liquid-phase compound. Furthermore, the characteristic of the liquid phase of easily segregating causes a trend to occur in that the liquid phase substances eccentrically remain in gap portions among AlN grains and coagulate to form a coarse and brittle grain boundary.

What is even worse, growth of the crystal grains easily proceeds and thus large and coarse crystal grains having an average grain size of 5 to 10 μm can easily be formed in the crystal structure of the sintered body as shown in FIG. 2. Furthermore, micro pores cannot be extinguished and retained in the crystal grains, thus preventing fine formation of the sintered body. As a result, there arises a problem in that an aluminum nitride sintered body having unsatisfactory three-point bending strength of about 350 to 400 MPa and insufficient fracture toughness of 2.8 $MN/m^{3/2}$ or less can be obtained.

In order to overcome the foregoing problems, attempts have been made that fine aluminum nitride raw material powder having an uniform grain size is used to form an AlN sintered body having a very fine crystal structure and that an additive is added to improve the sintering characteristics. The inventors of the present invention have disclosed a method having an arrangement that, for example, a tungsten component is contained to improve the sintering characteristics in order to obtain a strong AlN sintered body. However, a fact was found that the fracture toughness deteriorates though the crystal structure can be fined and uniformed and thus the sintered body can be strengthened due to containing of the tungsten component. Therefore, it has been difficult to obtain an AlN sintered body for a semiconductor board having both satisfactory strength and toughness.

In order to cope with a heat generating amount that has been increased in the recent trend of raising the integrating density of semiconductor device and enlarging the output from the same, the aluminum nitride material exhibiting excellent thermal conductivity (satisfactory heat radiation characteristics) has been used widely. Although the aluminum nitride material resulted in satisfactory heat radiation characteristics, the aforesaid unsatisfactory strength and toughness to serve as a structural member result in that a semiconductor board made of an aluminum nitride sintered body is damaged by small bending stress acting when the semiconductor substrate is mounted on an mounting board and by impulsive force acting at handling. As a result, there arises a problem in that the manufacturing yield of the semiconductor circuit boards critically deteriorates.

The present invention is achieved for solving the foregoing problems and therefore a first object of the present invention is to provide an AlN sintered body and a method of manufacturing the same capable of restricting the growth of the AlN sintered body grains and fining the structure of the sintered body and of strengthening combination of the grain boundary phase and crystal grains to improve the strength and fracture toughness of the sintered body and uniform the same, thereby improving the mechanical strength while maintaining the heat radiation characteristics.

DISCLOSURE OF INVENTION

In order to achieve the foregoing objects, the inventors of the present invention changed the method of synthesizing the aluminum nitride raw material powder, the distribution of the grain size of the AlN raw material powder, type and quantity of addition of a sintering agent and additives to be added to the aluminum nitride raw material powder and investigated the influence of the changes upon the crystal structure, crystal grain size distribution, strength characteristics, fracture toughness and heat transfer characteristics.

As a result, when an Si component and boron carbide ($B_4C$) serving as additives are, in small quantities, added to a predetermined AlN raw material powder in addition to a sintering agent in a composite manner and their mixture body is molded and sintered, a fine sintered body structure, having an average crystal grain size of 3 to 4.5 µm, in which the boron carbide improves bonding strength or connection of the grain boundary phase and AlN crystal grains and were dispersed uniformly was obtained and thus an AlN sintered body excellent in strength characteristics and fracture toughness was obtained. The present invention was thus established on the basis of the foregoing findings.

That is, the aluminum nitride sintered body according to the present invention comprises 1–10% by weight of at least one element selected from a group consisting of a group IIIa element listed in periodic table, Ca, Sr and Ba in terms of the amount of an oxide thereof; 0.2–2.0% by weight of boron carbide; at most 0.2% by weight of at least one silicon compound selected from a group consisting of $SiO_2$, $Si_3N_4$, SiC, $Si_2N_2O$, β-Sialon, α-Sialon and poly-type aluminum nitride (Al—Si—O—N) in terms of the amount of Si component; and the balance of aluminum nitride.

The aluminum nitride sintered body of the present invention should preferably further contain 0.05–0.5% by weight of an oxide of at least one metal element selected from the group consisting of Ti, Fe, Ni, Cr, Co, Li and Mg. The average crystal grain size of the sintered body should preferably be set within a range of from 2 to 4.5 µm. The AlN sintered body composed as described above and having the foregoing wide crystal grain size distribution has a thermal conductivity of at least 130 W/m·k, a three-point bending strength of at least 450 MPa and a fracture toughness of at least 3.0 $MN/m^{3/2}$.

The method of manufacturing an aluminum nitride sintered body according to the present invention comprises the steps of: forming a mixture powder by adding 1–10% by weight of at least one element selected from a group consisting of a group IIIa element listed in periodic table, Ca, Sr and Ba in terms of the amount of an oxide thereof, 0.2–2.0% by weight of boron carbide, and at most 0.2% by weight of at least one silicon compound selected from a group consisting of $SiO_2$, $Si_3N_4$, SiC, $Si_2N_2O$, β-Sialon, α-Sialon and poly-type aluminum nitride (Al—Si—O—N) in terms of the amount of Si component, to aluminum nitride raw material powder; molding the mixture powder to form a molded body; and sintering the resultant molded body in a temperature range of 1,650° to 1,900° C. in a non-oxidizing atmosphere.

The aluminum nitride (AlN) raw material powder to be used in the method according to the present invention and serving as the main component of the sintered body is fine AlN raw material powder having an average grain size of 0.5 to 2 µm, preferably of up to 1.5 µm, to improve the sintering characteristics and thermal conductivity by restricting the content of impure oxygen to up to 1.5% by weight.

The oxide of a group IIIa element of the periodic table, Ca, Sr or Ba acts as a sintering agent to densify or fine the AlN sintered body and is added in an amount within a range of 1–10% by weight relative to the aluminum nitride raw material powder. The sintering agent is exemplified by an oxide of any of rare earth element (Y, Sc, Ce, Dy or the like), a nitride, an oxide of any alkaline earth metals (Ca or the like) or a substance which forms the foregoing materials by a sintering process. In particular, it is preferable that yttrium oxide ($Y_2O_3$), cerium dioxide ($CeO_2$) or calcium oxide (CaO) be used.

If the quantity of the added sintering agent is under 1% by weight, the effect of improving the sintering characteristics cannot be exhibited sufficiently. In this case, the sintered body cannot be densified or fined, resulting in that a weak sintered body is formed or oxygen is solid-dissolved in AlN crystals. As the result, it cannot be possible to form a sintered body having a high thermal conductivity.

If the quantity of addition is over 10% by weight, the effect of the sintering agent is saturated excessively, causing the thermal conductivity of the resultant AlN sintered body to deteriorate. What is worse, grain boundary phases remain in a large quantity in the sintered body and the volume of the grain boundary phases to be removed by heat treatment is too large, thus resulting in that pores or voids remain in the sintered body. As a result, the contraction ratio is increased and thus deformation easily takes place.

The Si-component has an effect of improving the sintering characteristics and lowering the sintering temperature. Particularly when it is added, in a composite manner, together with the sintering agent, the grain growth of the sintered body can be prevented and thus a fine AlN crystal structure is formed so as to improve the structural strength of the sintered body. As the Si component, it is preferable that a silicon compound be used which is exemplified by $SiO_2$, $Si_3O_4$, SiC, $Si_3N_2O$, β-Sialon (Si—Al—O—N), α-Sialon and poly-type aluminum nitride (Al—Si—O—N).

The content of the silicon compound is, in the form of an Si component, adjusted within a range of up to 0.2% by weight. However, when a content of the Si component is under 0.01% by weight, the effect of restricting the growth of the grains becomes unsatisfactory. In this case, a coarse crystal structure is formed and thus a strong AlN sintered body cannot be obtained. If the same is added excessively in a quantity of over 0.2% by weight, thermal conductivity of the sintered body deteriorates and bending strength may sometimes deteriorate.

Boron carbide ($B_4C$) has an effect of increasing coupling of grain boundaries and crystal grains of the AlN sintered body and of hindering propagation of cracks through uniform dispersion in the structure of the sintered body. It has furthermore an effect of further improving fracture toughness of the AlN sintered body. The content of $B_4C$ is adjusted within a range of from 0.2 to 2.0% by weight. When a $B_4C$ content is under 0.2% by weight, the toughness improving effect as described above is insufficient. When the $B_4C$ content is over 2.0% by weight, on the other hand, thermal conductivity of the sintered body deteriorates.

The oxide of Ti, Fe, Ni, Cr, Co, Li or Mg lowers the sintering temperature and thus improves the sintering characteristics. Furthermore, the oxide is able to effectively improve the characteristics of the AlN sintered body such that it colors the sintered body to form an opaque sintered body. It may be added in a quantity within a range of 0.05–0.5% by weight as converted into oxide. If the quantity of addition is under 0.05% by weight, the foregoing effect of improving the characteristics becomes insufficient. If the same exceeds 0.5% by weight, on the other hand, thermal conductivity of the AlN sintered body deteriorates similarly to the impurities.

As impurity cations other than the foregoing additives tend to form compounds hindering thermal conduction of the AlN sintered body, the content thereof in the AlN sintered body should be at most 0.2% by weight.

The AlN raw material powder, the selected sintering agent, the Si compound serving as the Si component and $B_4C$ are injected, for example, into a crushing mixer such as a ball mill, so as to be mixed for a predetermined period of time, thus resulting in formation of a mixture of the raw materials. Then, the resultant mixture of the raw materials is injected into a mold having a prescribed shape so as to be pressurized and molded, thus forming a molded body. If an organic binder, such as paraffin or stearic acid, is added in advance in a quantity of 5–10% by weight, the molding process can be performed smoothly.

As the molding method, any of the following methods may be employed: a general press-molding method, slip casting method, isostatic pressing method, extrusion molding method or sheet molding method such as a doctor blade method.

After the completion of the foregoing forming operation, the molded body is heated to 400° to 550° C. in the air or heated in a non-oxidizing atmosphere, for example, nitrogen gas atmosphere to 400° to 800° C., so as to sufficiently dewax and remove the organic binder added previously.

A plurality of the dewaxed sheet-like molded bodies are stacked in a sintering furnace through a releasing powder or agent made of, for example, ceramic sintered powder. In the foregoing state, the plurality of the molded bodies are collectively sintered at a prescribed temperature. The sintering process is performed in a non-oxidizing atmosphere by heating the molded bodies at a temperature of from 1,650° to 1,900° C. for two to six hours. Particularly, by adding the Si component, the sintering process can be performed at a lower temperature of from 1,720° to 1,780° C., as compared with the conventional manufacturing process.

While the sintering atmosphere may be a non-oxidizing atmosphere not reacting with AlN, the process is usually carried out in nitrogen gas atmosphere or in reducing gas atmosphere containing nitrogen gas. As the reducing gas, $H_2$ gas or CO gas may be used. The sintering process may be conducted in vacuum (containing reducing atmosphere in a small quantity), reduced-pressure, pressurized or normal pressure atmosphere.

If sintering is performed at a low temperature, for example, of under 1,650° C., it is difficult to densify or fine the structure although the degree of the difficulty depends upon the grain size of the raw material powder and the oxygen content. In this case, the characteristics, such as strength and thermal conductivity, tend to become unsatisfactory. If the sintering is performed at a temperature higher than 1,900° C., on the other hand, the vapor pressure of AlN in the sintering furnace is raised excessively, so that it becomes difficult to densify the structure. What is worse, there is a risk of rapidly deteriorating thermal conductivity. The sintering temperature should therefore be set within the foregoing range.

By molding, dewaxing and sintering the raw material mixture body having a predetermined composition in which the sintering agent, $B_4C$ and Si component are added to the AlN raw material powder, a strong and tough AlN sintered body can be obtained which has a fine crystal structure with an average crystal grain size of from 3.0 to 4.5 μm, an improved coupling of grain boundaries and AlN crystal grains, a crystal structure in which $B_4C$ particles are uniformly dispersed, a thermal conductivity of at least 130 W/m K, a bending strength of at least 450 MPa, and a fracture toughness of at least 3.0 $MN/m^{3/2}$.

According to the thus structured aluminum nitride sintered body and the method of manufacturing the same, the AlN sintered body is formed by adding, in a composite manner, the sintering agent comprising the oxide of a group IIIa element listed in periodic table, Ca, Sr or Ba, the Si component and $B_4C$ in prescribed quantities. A crystal structure with a crystal grain size appropriately controlled by the Si component is available. The degree of coupling of grain boundaries and AlN crystal grains is improved by $B_4C$ in the resultant crystal structure, in which $B_4C$ particles are uniformly dispersed. As a result, there is available an aluminum nitride sintered body which effectively prevents propagation of cracks and is excellent in strength characteristics and fracture toughness.

BEST MODE FOR CARRYING OUT THE INVENTION

The aluminum nitride sintered body according to the present invention will now be described further in detail with reference to the following examples.

EXAMPLES 1 TO 30

An Si component, $B_4C$ and $Y_2O_3$, $TiO_2$, $Fe_2O_3$, NiO, $Cr_2O_3$, CoO, $Li_2O$, MgO, $SiO_2$, $Si_3N_4$, SiC, $Si_2N_2O$, α-Sialon, β-Sialon, poly-type AlN, CaO, BaO and SrO as the sintering agent in prescribed quantities were added, as shown in Table 1, to three kinds of aluminum nitride raw material powder including an aluminum nitride powder (A) prepared by the reduction nitriding synthesis method, containing 0.8% by weight of oxygen as an impurity and having an average grain size of 1 μm, an aluminum nitride powder (B) prepared by the direct nitriding synthesis method, containing 1.2% by weight of oxygen as an impurity and having an average grain size of 1.3 μm, and an aluminum nitride powder (C) prepared by mixing the foregoing aluminum nitride powder (A) and (B) at a weight ratio of 1:1, and the resultant mixture was mixed in a ball mill with ethyl alcohol as the solvent for 20 hours, thereby preparing a raw material mixture. Then, paraffin in a quantity of 5.5% by weight was added as an organic binder to the resultant raw material mixture, thereby preparing granules.

Each of the resultant granules was injected into a mold of a press machine so as to be compressed in a single axial direction under a pressure of 1,200 $kg/cm^2$, so that a multiplicity of rectangular molded bodies each having a size of 50 mm×50 mm×5 mm thick were manufactured. Then, each molded body was heated at 450° C. for one hour in the air for dewaxing.

Then, each of the dewaxed molded bodies was accommodated into a sintering chamber made of AlN so as to be sintered in a sintering furnace into densified bodies at 1,720° to 1,780° C., which was the lowest temperature of sintering as shown in Table 1. Then, the densified bodies were cooled at a cooling rate of 200° C./hour, so that AlN sintered bodies according to Examples 1 to 30 were manufactured.

COMPARATIVE EXAMPLE 1

As shown in Table 2, on the other hand, a raw material was prepared, and preparation of the raw material, molding dewaxing and sintering were performed under the same conditions as in Example 1 except that no Si component nor $B_4C$ was added, only a conventional sintering agent was added and sintering was carried out at 1,800° C., thus preparing an AlN sintered body according to Comparative Example 1, having the same size as in Example 1.

COMPARATIVE EXAMPLE 2

An AlN sintered body according to Comparative Example 2 was prepared, without adding an Si component, under the same conditions as in Example 2 except for sintering at a temperature of 1,780° C.

COMPARATIVE EXAMPLE 3

An AlN sintered body according to Comparative example 3 having the same size as in Example 10 was prepared by using the AlN raw material (B) used in Example 10, and carrying out raw material preparation, molding, dewaxing and sintering under the same conditions as in Example 10 except that no Si component was added and sintering was performed at a temperature of 1,780° C.

COMPARATIVE EXAMPLE 4

An AlN sintered body according to Comparative Example 4 was prepared in the same manner as in Example 2 except that $Y_2O_3$ was added as the sintering agent in an excessive quantity of 15% by weight and sintering was carried out at 1,800° C.

COMPARATIVE EXAMPLE 5

An AlN sintered body according to Comparative Example 5 was prepared in the same manner as in Example 2 except that $Si_3N_4$ was added as the Si component in an excessive quantity of 0.3% by weight (as converted into Si) and sintering was performed at 1,720° C.

COMPARATIVE EXAMPLE 6

An AlN sintered body according to Comparative Example 6 was prepared in the same manner as in Example 2 except that $B_4C$ was added in a excessive quantity of 3% by weight and sintering was conducted at 1,780° C.

COMPARATIVE EXAMPLE 7

An AlN sintered body according to Comparative Example 7 was prepared in the same manner as in Example 7 except that: $TiO_2$ was added in an excessive quantity of 1% by weight, in addition to $Y_2O_3$; $Si_3N_4$ was added in a quantity of 0.2% by weight as an Si component; $B_4C$ was added in a quantity of 0.5% by weight; and sintering was performed at 1,700° C.

In order to evaluate strength characteristics and heat radiating characteristics of the thus obtained AlN sintered bodies according to Examples 1 to 30 and Comparative Examples 1 to 7, the three-point bending strength, fracture toughness, thermal conductivity and average crystal grain size (D50) of each sample were measured. Thus, the results as shown in Table 3 were obtained. The values of fracture toughness are those measured by the Niihara system based on the micro-indentation method. The chemical composition and the sintering temperature for each AlN sintered body are also shown in Tables 1 and 2.

TABLE 1

| | | Ratio of Raw Material Mixture (wt. %) | | | | | | | | Lowest |
|---|---|---|---|---|---|---|---|---|---|---|
| | | Sintering Agent Component | | | | Si Component | | AlN Powder | | Temperature |
| | Sample No. | Type | Quantity of Addition | Type | Quantity of Addition | $B_4C$ | Calculated as Si | Source of Addition | Type | Quantity of Addition | for sintering (°C.) |
| Example | 1 | $Y_2O_3$ | 5 | — | — | 0.2 | 0.1 | $Si_3N_4$ | A | Bal. | 1740 |
| | 2 | $Y_2O_3$ | 5 | — | — | 0.5 | 0.1 | $Si_3N_4$ | A | Bal. | 1760 |
| | 3 | $Y_2O_3$ | 5 | — | — | 1 | 0.1 | $Si_3N_4$ | A | Bal. | 1760 |
| | 4 | $Y_2O_3$ | 5 | — | — | 2 | 0.1 | $Si_3N_4$ | A | Bal. | 1780 |
| | 5 | $Y_2O_3$ | 5 | — | — | 0.5 | 0.01 | $Si_3N_4$ | A | Bal. | 1760 |
| | 6 | $Y_2O_3$ | 5 | — | — | 0.5 | 0.05 | $Si_3N_4$ | A | Bal. | 1740 |
| | 7 | $Y_2O_3$ | 5 | — | — | 0.5 | 0.2 | $Si_3N_4$ | A | Bal. | 1720 |
| | 8 | $Y_2O_3$ | 1 | — | — | 0.5 | 0.1 | $Si_3N_4$ | A | Bal. | 1760 |
| | 9 | $Y_2O_3$ | 10 | — | — | 0.5 | 0.1 | $Si_3N_4$ | A | Bal. | 1780 |
| | 10 | $Y_2O_3$ | 5 | — | — | 0.5 | 0.1 | $Si_3N_4$ | B | Bal. | 1780 |
| | 11 | $Y_2O_3$ | 5 | — | — | 0.5 | 0.1 | $Si_3N_4$ | C | Bal. | 1760 |
| | 12 | $Y_2O_3$ | 5 | — | — | 0.5 | 0.05 | $SiO_2$ | A | Bal. | 1740 |
| | 13 | $Y_2O_3$ | 5 | — | — | 0.5 | 0.05 | SiC | A | Bal. | 1740 |
| | 14 | $Y_2O_3$ | 5 | — | — | 0.5 | 0.05 | $Si_2N_2O$ | A | Bal. | 1740 |
| | 15 | $Y_2O_3$ | 5 | — | — | 0.5 | 0.1 | α-Sialon | A | Bal. | 1740 |
| | 16 | $Y_2O_3$ | 5 | — | — | 0.5 | 0.1 | β-Sialon | A | Bal. | 1740 |
| | 17 | $Y_2O_3$ | 5 | — | — | 0.5 | 0.1 | Poly-Type AlN | A | Bal. | 1740 |
| | 18 | $Y_2O_3$ | 5 | $TiO_2$ | 0.1 | 0.5 | 0.05 | $Si_3N_4$ | A | Bal. | 1720 |
| | 19 | $Y_2O_3$ | 5 | $TiO_2$ | 0.5 | 0.5 | 0.05 | $Si_3N_4$ | A | Bal. | 1700 |
| | 20 | $Y_2O_3$ | 5 | $Fe_2O_3$ | 0.1 | 0.5 | 0.05 | $Si_3N_4$ | A | Bal. | 1720 |
| | 21 | $Y_2O_3$ | 5 | NiO | 0.1 | 0.5 | 0.05 | $Si_3N_4$ | A | Bal. | 1720 |
| | 22 | $Y_2O_3$ | 5 | $Cr_2O_3$ | 0.1 | 0.5 | 0.05 | $Si_3N_4$ | A | Bal. | 1720 |
| | 23 | $Y_2O_3$ | 5 | CoO | 0.1 | 0.5 | 0.05 | $Si_3N_4$ | A | Bal. | 1720 |
| | 24 | $Y_2O_3$ | 5 | $Li_2O$ | 0.1 | 0.5 | 0.05 | $Si_3N_4$ | A | Bal. | 1720 |
| | 25 | $Y_2O_3$ | 5 | MgO | 0.1 | 0.5 | 0.05 | $Si_3N_4$ | A | Bal. | 1720 |

TABLE 1-continued

| | | Ratio of Raw Material Mixture (wt. %) | | | | | | | Lowest |
|---|---|---|---|---|---|---|---|---|---|
| | | Sintering Agent Component | | | | Si Component | | AlN Powder | Temperature |
| Sample No. | Type | Quantity of Addition | Type | Quantity of Addition | $B_4C$ | Calculated as Si | Source of Addition | Type | Quantity of Addition | for sintering (°C.) |
| 26 | CaO | 3 | — | — | 0.5 | 0.1 | $Si_3N_4$ | A | Bal. | 1780 |
| 27 | BaO | 3 | — | — | 0.5 | 0.1 | $Si_3N_4$ | A | Bal. | 1780 |
| 28 | SrO | 3 | — | — | 0.5 | 0.05 | $Si_3N_4$ | A | Bal. | 1780 |
| 29 | $Y_2O_3$ | 5 | $TiO_2$ | 0.2 | 0.5 | 0.05 | $Si_3N_4$ | B | Bal. | 1760 |
| 30 | $Y_2O_3$ | 5 | $Fe_2O_3$ | 0.1 | 0.5 | 0.1 | $Si_3N_4$ | B | Bal. | 1760 |

TABLE 2

| | | | Ratio of Raw Material Mixture (wt. %) | | | | | | | Lowest |
|---|---|---|---|---|---|---|---|---|---|---|
| | | | Sintering Agent Component | | | | Si Component | | AlN Powder | Temperature |
| | Sample No. | Type | Quantity of Addition | Type | Quantity of Addition | $B_4C$ | Calculated as Si | Source of Addition | Type | Quantity of Addition | for sintering (°C.) |
| Comparative Example | 1 | $Y_2O_3$ | 5 | — | — | — | — | — | A | Bal. | 1800 |
| | 2 | $Y_2O_3$ | 5 | — | — | 0.5 | — | — | A | Bal. | 1780 |
| | 3 | $Y_2O_3$ | 5 | — | — | 0.5 | — | — | B | Bal. | 1780 |
| | 4 | $Y_2O_3$ | 15 | — | — | 0.5 | 0.1 | $Si_3N_4$ | A | Bal. | 1800 |
| | 5 | $Y_2O_3$ | 5 | — | — | 0.5 | 0.3 | $Si_3N_4$ | A | Bal. | 1720 |
| | 6 | $Y_2O_3$ | 5 | — | — | 3 | 0.1 | $Si_3N_4$ | A | Bal. | 1780 |
| | 7 | $Y_2O_3$ | 5 | $TiO_2$ | 1 | 0.5 | 0.2 | $Si_3N_4$ | A | Bal. | 1700 |

TABLE 3

| | Sample No. | Three-Point Bending Strength (MPa) | Fracture Toughness ($MN/m^{3/2}$) | Thermal Conductivity (W/m · K) | Grain Size D50(μm) |
|---|---|---|---|---|---|
| Example | 1 | 515 | 3.05 | 164 | 3.5 |
| | 2 | 580 | 3.10 | 162 | 3 |
| | 3 | 550 | 3.15 | 160 | 3 |
| | 4 | 490 | 3.18 | 148 | 3 |
| | 5 | 500 | 3.15 | 180 | 4 |
| | 6 | 510 | 3.10 | 174 | 3.5 |
| | 7 | 590 | 3.08 | 149 | 3 |
| | 8 | 506 | 3.15 | 140 | 3.7 |
| | 9 | 500 | 3.05 | 162 | 4 |
| | 10 | 510 | 3.40 | 150 | 4.5 |
| | 11 | 525 | 3.25 | 156 | 4 |
| | 12 | 520 | 3.12 | 172 | 3.5 |
| | 13 | 528 | 3.10 | 170 | 3.5 |
| | 14 | 555 | 3.12 | 169 | 3 |
| | 15 | 540 | 3.15 | 160 | 3 |
| | 16 | 550 | 3.10 | 159 | 3 |
| | 17 | 560 | 3.20 | 165 | 3 |
| | 18 | 525 | 3.22 | 167 | 3.5 |
| | 19 | 545 | 3.25 | 144 | 3 |
| | 20 | 530 | 3.20 | 160 | 3.5 |
| | 21 | 535 | 3.15 | 160 | 3 |
| | 22 | 560 | 3.10 | 160 | 3 |
| | 23 | 500 | 3.08 | 152 | 3.5 |
| | 24 | 475 | 3.15 | 156 | 4.5 |
| | 25 | 490 | 3.12 | 158 | 4 |
| | 26 | 495 | 3.05 | 145 | 4.5 |
| | 27 | 480 | 3.10 | 140 | 4.5 |
| | 28 | 480 | 3.04 | 142 | 4.5 |
| | 29 | 530 | 3.50 | 141 | 3.5 |
| | 30 | 545 | 3.50 | 140 | 3.5 |
| Comparative Example | 1 | 400 | 2.70 | 190 | 5.5 |
| | 2 | 420 | 3.10 | 180 | 5 |
| | 3 | 440 | 3.15 | 160 | 5 |
| | 4 | 435 | 2.95 | 150 | 5 |
| | 5 | 510 | 3.10 | 128 | 4 |
| | 6 | 445 | 2.95 | 130 | 5 |
| | 7 | 520 | 3.10 | 128 | 4 |

As is clear from the results shown in Tables 1 to 3, the AlN sintered bodies according to Examples 1 to 30 in which $B_4C$ and Si component were added in small quantities in a composite manner in addition to the sintering agents such as $Y_2O_3$ and CaO have a very fine crystal grain size of from 3 to 4.5 μm, a degree of coupling of grain boundaries and AlN crystal grains improved by $B_4C$, a crystal structure in which $B_4C$ particles are uniformly dispersed, and are excellent in bending strength as well as in fracture toughness and thermal conductivity because propagation of cracks is prevented by $B_4C$ particles.

On the other hand, the AlN sintered bodies according to Comparative Examples 1, 2 and 3 to which no Si component is added, while some of which are superior to Examples 1 to 30 in thermal conductivity, have difficulty in general in a low bending strength, durability and handling facility. In the sample of Comparative Example 5 to which the Si component is added in an excessive quantity, thermal conductivity is insufficient. It was confirmed that, in the sample of Comparative Example 4 to which $Y_2O_3$ as the conventional sintering agent is added in an excessive quantity, both thermal conductivity and strength deteriorate despite the addition of the Si component.

Furthermore, the AlN sintered body according to Comparative Example 7 to which $TiO_2$ is added in an appropriate quantity has a bending strength and toughness of the same level as those of the samples according to Examples 1 to 30, with however an insufficient thermal conductivity. It was confirmed that in the AlN sintered body according to Comparative Example 6, to which $B_4C$ is added in an excessive quantity, thermal conductivity, bending strength and fracture toughness deteriorate.

INDUSTRIAL APPLICABILITY

According to the ceramic sintered body and the method of manufacturing the same of the present invention, as described above, because the AlN sintered body is formed by adding, in a composite manner, an Si component and $B_4C$ in prescribed quantities in addition to the sintering agent comprising the oxide of a group IIIa element listed in periodic table, Ca, Sr and Ba, there is available a crystal structure in which the size of crystal grains is appropriately controlled by the Si component. $B_4C$ improves the degree of coupling of grain boundaries and AlN crystal grains, and a crystal structure having a micro-structure in which $B_4C$ particles are uniformly dispersed is obtained. There is thus available an aluminum nitride sintered body excellent both in strength characteristics and fracture toughness value, propagation of cracks being effectively prevented.

What is claimed is:

1. An aluminum nitride sintered body comprising: 1–10% by weight of at least one element selected from a group consisting of a group IIIa element listed in periodic table, Ca, Sr and Ba in terms of the amount of oxide thereof; 0.2–2.0% by weight of boron carbide; at most 0.2% by weight of at least one silicon compound selected from a group consisting of $SiO_2$, $Si_3N_4$, SiC, $Si_2N_2O$, β-Sialon, α-Sialon and poly-type aluminum nitride (Al—Si—O—N) in terms of the amount of Si component; and the balance of aluminum nitride, wherein said sintered body has a fracture toughness of at least 3 $MN/m^{3/2}$.

2. An aluminum nitride sintered body according to claim 1, wherein said sintered body contains 0.05–0.5% by weight of at least one metal element selected from a group consisting of Ti, Fe, Ni, Cr, Co, Li and Mg in terms of the amount of an oxide thereof.

3. An aluminum nitride sintered body according to claim 1, wherein said sintered body has a three-point bending strength of at least 450 MPa.

4. An aluminum nitride sintered body according to claim 1, wherein said sintered body has a thermal conductivity of at least 130 W/m K.

5. A method of manufacturing an aluminum nitride sintered body, which comprises the steps of:

forming a mixture powder by adding 1–10% by weight of at least one element selected from a group consisting of a group IIIa element listed in periodic table, Ca, Sr and Ba in terms of the amount of an oxide thereof, 0.2–2.0% by weight of boron carbide, and at most 0.2% by weight of at least one silicon compound selected from a group consisting of $SiO_2$, $Si_3N_4$, SiC, $Si_2N_2O$, β-Sialon, α-Sialon and poly-type aluminum nitride (Al—Si—O—N) in terms of the amount of Si component, to aluminum nitride raw material powder;

molding said mixture powder to form a molded body; and sintering the resultant molded body in a temperature range of 1,650° to 1,900° C. in a non-oxidizing atmosphere.

6. A method of manufacturing an aluminum nitride sintered body according to claim 5, wherein 0.05–0.5% by weight of said aluminum nitride raw material powder are replaced by an oxide of at least one metal element selected from a group consisting of Ti, Fe, Ni, Cr, Co, Li and Mg.

7. A method of manufacturing an aluminum nitride sintered body according to claim 5, wherein the oxygen content in said aluminum nitride raw material powder is limited to at most 1.5% by weight.

8. A product produced by the method of claim 5.

9. A product produced by the method of claim 6.

10. A product produced by the method of claim 7.

11. The product of claim 9, wherein said product has a fracture toughness of at least 3 $MN/m^{3/2}$.

12. The product of claim 9, wherein said product has a fracture toughness of at least 3 $MN/m^{3/2}$.

13. The product of claim 10, wherein said product has a fracture toughness of at least 3 $MN/m^{3/2}$.

14. The method of claim 5, further comprising adding 5–10% by weight of an organic binder.

15. The method of claim 14, further comprising heating said molded body to 400°–800° C.

16. The method of claim 5, wherein said sintering is carried out in a temperature range of 1,720° to 1,780° C.

17. The aluminum nitride sintered body of claim 1, wherein said sintered body has an average crystal grain size of from 3.0 to 4.5 μm.

18. The method of claim 5, wherein said aluminum nitride sintered body has a fracture toughness of at least 3 $MN/m^{3/2}$.

19. The method of claim 6, wherein said aluminum nitride sintered body has a fracture toughness of at least 3 $MN/m^{3/2}$.

20. The method of claim 7, wherein said aluminum nitride sintered body has a fracture toughness of at least 3 $MN/m^{3/2}$.

* * * * *